United States Patent
Kase et al.

(10) Patent No.: US 10,372,024 B2
(45) Date of Patent: Aug. 6, 2019

(54) ELECTRONIC UNIT HAVING HEAT DISSIPATING DEVICE, METHOD FOR FABRICATING ELECTRONIC UNIT AND PROJECTOR HAVING ELECTRONIC UNIT

(71) Applicant: CASIO COMPUTER CO., LTD., Tokyo (JP)

(72) Inventors: Toshifumi Kase, Fuchu (JP); Hirofumi Fujikura, Hino (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/066,024

(22) Filed: Mar. 10, 2016

(65) Prior Publication Data

US 2016/0344988 A1 Nov. 24, 2016

(30) Foreign Application Priority Data

May 20, 2015 (JP) ................................. 2015-103186

(51) Int. Cl.
*G03B 21/16* (2006.01)
*H04N 9/31* (2006.01)
*H05K 13/00* (2006.01)

(52) U.S. Cl.
CPC ........... *G03B 21/16* (2013.01); *H04N 9/3144* (2013.01); *H05K 13/00* (2013.01)

(58) Field of Classification Search
CPC .................. G03B 21/16; H04N 9/3144; H01L 2924/0002; H01L 2924/00; H01L 2023/405; H01L 2023/4087; H01L 23/4006; H01L 2023/4037; H01L 2023/4043; H01L 2023/4056; H01L 2023/4062; H01L 2023/4068

See application file for complete search history.

(56) References Cited

U.S. PATENT DOCUMENTS 5,420,461 A * 5/1995 Mallik ................ H01L 21/4853
257/696
6,791,838 B1 * 9/2004 Hung .................. H01L 23/4006
165/185

(Continued)

FOREIGN PATENT DOCUMENTS

JP 2013-196946 A 9/2013

*Primary Examiner* — Bao-Luan Q Le
(74) *Attorney, Agent, or Firm* — Scully Scott Murphy & Presser

(57) ABSTRACT

An electronic unit is provided including a heat dissipating device having a projecting heat transfer portion, a substrate on one surface side of which the heat dissipating device is disposed and in which an opening portion where the heat transfer portion is inserted is formed, an electronic part disposed on the other surface side of the substrate so that a heat dissipating surface is positioned in the opening portion and connected to the substrate via a frame-shaped connecting portion disposed with a gap between the substrate and itself, and a heat conductive member provided between the heat transfer portion and the heat dissipating surface and between an outer circumference of the heat transfer portion and an inner circumference of the connecting portion, wherein an end portion of the heat conductive member is positioned closer to the heat dissipating device than the gap between the connecting portion and the substrate.

19 Claims, 9 Drawing Sheets

(56) References Cited

U.S. PATENT DOCUMENTS

| | | | |
|---|---|---|---|
| 7,275,833 B2* | 10/2007 | Saito | H01L 23/4006 257/E23.084 |
| 7,612,440 B2* | 11/2009 | Rancuret | H01L 23/4006 257/678 |
| 7,798,651 B2* | 9/2010 | Wu | G03B 21/16 348/771 |
| 7,815,316 B2* | 10/2010 | Sun | H04N 9/3144 165/80.3 |
| 7,847,381 B2* | 12/2010 | Rancuret | H01L 23/4006 257/678 |
| 7,952,178 B2* | 5/2011 | Rancuret | H01L 23/4006 257/678 |
| 9,541,818 B2* | 1/2017 | Mikawa | G03B 21/16 |
| 2004/0150798 A1* | 8/2004 | Tsao | G03B 21/008 353/75 |
| 2004/0174679 A1* | 9/2004 | Hung | H01L 23/4006 361/704 |
| 2005/0111190 A1* | 5/2005 | Wang | H01L 23/367 361/704 |
| 2005/0265001 A1* | 12/2005 | Saito | H01L 23/4006 361/710 |
| 2006/0261457 A1* | 11/2006 | Rancuret | H01L 23/4006 257/679 |
| 2007/0126997 A1* | 6/2007 | Kang | G03B 21/005 353/99 |
| 2007/0281501 A1* | 12/2007 | Ju | H01R 13/2435 439/66 |
| 2008/0024733 A1* | 1/2008 | Gerets | G02F 1/133553 353/52 |
| 2008/0246923 A1* | 10/2008 | Wu | G03B 21/16 353/52 |
| 2008/0265924 A1* | 10/2008 | Barabi | G01R 1/0483 324/756.01 |
| 2009/0086171 A1* | 4/2009 | Sun | H04N 9/3144 353/52 |
| 2010/0019366 A1* | 1/2010 | Rancuret | H01L 23/4006 257/678 |
| 2010/0295572 A1* | 11/2010 | Ryu | G01R 1/0483 324/765.01 |
| 2011/0057303 A1* | 3/2011 | Rancuret | H01L 23/4006 257/697 |
| 2012/0081617 A1* | 4/2012 | Cho | H04N 9/3144 348/748 |
| 2012/0327316 A1* | 12/2012 | Okada | G03B 21/16 348/748 |
| 2014/0375966 A1* | 12/2014 | Mikawa | H04N 9/3144 353/57 |

* cited by examiner

ELECTRONIC UNIT HAVING HEAT DISSIPATING DEVICE, METHOD FOR FABRICATING ELECTRONIC UNIT AND PROJECTOR HAVING ELECTRONIC UNIT

CROSS-REFERENCE TO RELATED APPLICATION

This application is based upon and claims the benefit of priority under 35 USC 119 from Japanese Patent Application No. 2015-103186 filed on May 20, 2015, the entire disclosure of which, including the description, claims, drawings and abstract, is incorporated herein by reference.

BACKGROUND OF THE INVENTION

Field of the Invention

The present invention relates to an electronic unit and an electronic unit fabrication method.

Description of the Related Art

As equipment having an electronic unit incorporated therein, there is raised a projector for projecting a screen or a video image of a personal computer and further an image based on image data stored on a memory card onto a screen.

A projector disclosed in Japanese Unexamined Patent Publication No. 2013-196946 includes electronic devices such as a red light source device including a red light emitting diode and an excitation light shining device including a plurality device. Excitation light emitted from the excitation light shining device is shone on to a luminescent wheel, which then emits green luminous light. Then, respective red, green and blue light emitted from the red, blue and green light sources is shone on to an electronic unit which incorporates a display device which is made up of DMDs (Digital Micromirror Devices), whereby a color image is projected on to a screen via a projection-side optical system.

The electronic parts and device such as the red light emitting diode, the blue laser diode and the display device made up of the DMDs generate heat when the projector is driven. Thus, heat sinks are used for the electronic devices including these electronic parts to cool the electronic parts.

Generally speaking, sometimes electronic parts cannot exhibit their predetermined performances when dust adheres to them. For example, when dust adheres to the semiconductor devices such as the red light emitting diode and the blue laser diode of the projector, there are fears that the luminance is reduced. Additionally, when dust adheres to the display device made up of the DMDs, pixels are lost, and color shading is produced, leading to a reduction in image quality. However, it is difficult to close tightly a connecting surface of a member which supports an electronic part like those described above which generate heat.

SUMMARY OF THE INVENTION

An object of the invention is to provide an electronic unit which can reduce the adhesion of dust to an electronic part, a fabrication method of this electronic unit, and a projector which includes the electronic unit.

According to an aspect of the invention, there is provided an electronic unit including:

a heat dissipating device having a projecting heat transfer portion;

a substrate on one surface side of which the heat dissipating device is disposed and in which an opening portion where the heat transfer portion of the heat dissipating device is inserted is formed;

an electronic part which is disposed on the other surface side of the substrate so that a heat dissipating surface is positioned in the opening portion of the substrate and which is connected to the substrate via a frame-shaped connecting portion which is disposed with a gap defined between the substrate and itself; and a heat conductive member which is provided between the heat transfer portion of the heat dissipating device and the heat dissipating surface of the electronic part and between an outer circumference of the heat transfer portion of the heat dissipating device and an inner circumference of the connecting portion, wherein an end portion of the heat conductive member is positioned closer to the heat dissipating device than the gap defined between the connecting portion and the substrate.

According to another aspect of the invention, there is provided a projector including:

the electronic unit which is configured as a display device;

a light source unit comprising a red light source device, a green light source device, and a blue light source device;

a light source-side optical system configured to guide light from the light source unit to the display device;

a projection-side optical system configured to project an image emitted from the display device; and a projector control unit configured to control the light source unit and the display device.

According to a further aspect of the invention, there is provided a fabrication method including:

disposing a substrate having an opening portion and a heat dissipating surface of an electronic part which is connected to the substrate via a frame-shaped connecting portion which is disposed with a gap defined between the substrate and itself so as to face each other and fixing them in position;

placing a sheet-shaped heat conductive member having a predetermined thickness on the heat dissipating surface of the electronic part; and inserting a heat dissipating device having a heat dissipating portion and a projecting heat transfer portion configured to transfer heat to the heat dissipating portion at the projecting heat transfer portion into the opening portion and plastically deforming the heat conductive member so that an end portion of the heat conductive member is positioned closer to the heat dissipating device than the gap defined between the connecting portion and the substrate.

DETAILED DESCRIPTION OF THE PREFERRED EMBODIMENT

Figure 1:
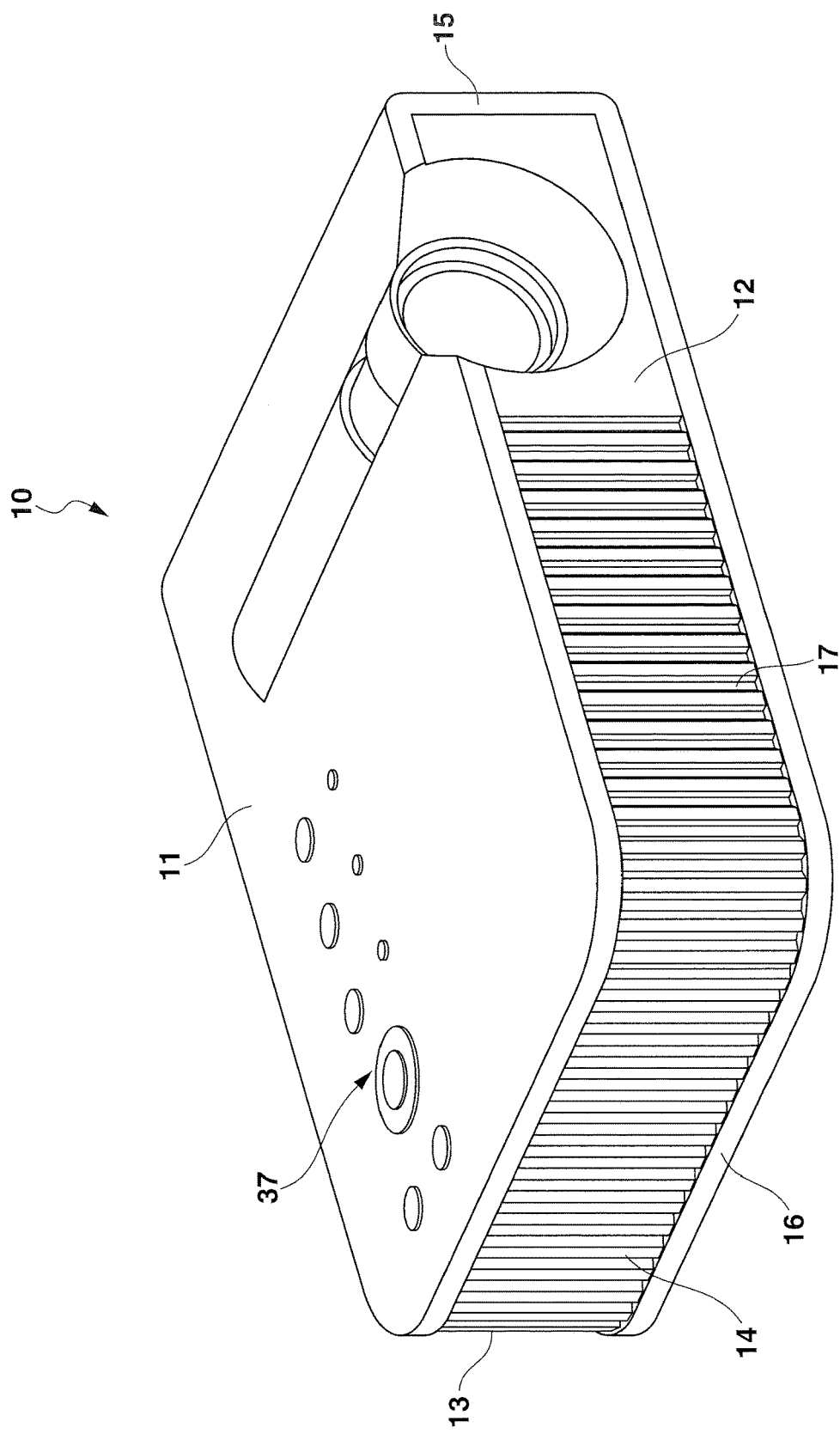
FIG. 1 is an external perspective view of a projector according to an embodiment of the invention.

Hereinafter, an embodiment of the invention will be described by reference to the accompanying drawings. FIG. 1 is an external perspective view of a projector 10. In this embodiment, when referred to in relation to the direction of the projector 10, left and right denote, respectively, left and right in relation to the projecting direction of the projector 10, and when referred to in relation to the direction of the projector 10, front and rear denote, respectively, front and rear in relation to the direction of a screen and a traveling direction of a pencil of light that is emitted from the projector 10 towards a screen.

As shown in FIG. 1, the projector 10 has a housing of a substantially rectangular parallelepiped shape. The housing of the projector 10 is formed of a side panel which has a front panel 12, a back panel 13, a right side panel 14 and a left side panel 15, an upper panel 11 and a lower panel 16. The projector 10 has a projecting portion at a left side portion of the front panel 12. A plurality of inlet and outlet slits 17 are provided in the front panel 12. Additionally, although not shown, the projector 10 includes an IR reception unit which receives a control signal from a remote controller.

In addition, a keys/indicators unit 37 is provided on the upper panel 11. Disposed on this keys/indicators unit 37 are keys and indicators which include a power supply switch key, a power indicator, a projection switch key, and an overheat indicator. The power indicator informs whether the power supply is on or off. The projection switch key switches on or off the projection by the projector 10. The overheat indicator informs of an overheat condition occurring in a light source unit, a display device, or a control unit when they really overheat.

Further, provided on the back panel 13 are an input/output connector unit where USB terminals, a video signal input D-SUB terminal into which analog RGB video signals are input, an S terminal, an RCA terminal and a voice output terminal are provided and various types of terminals including a power supply adaptor. Additionally, a plurality of outside air inlet slits 18 are formed in the back panel of the casing. A plurality of outside air inlet slits are formed in the back panel 13.

Figure 2:
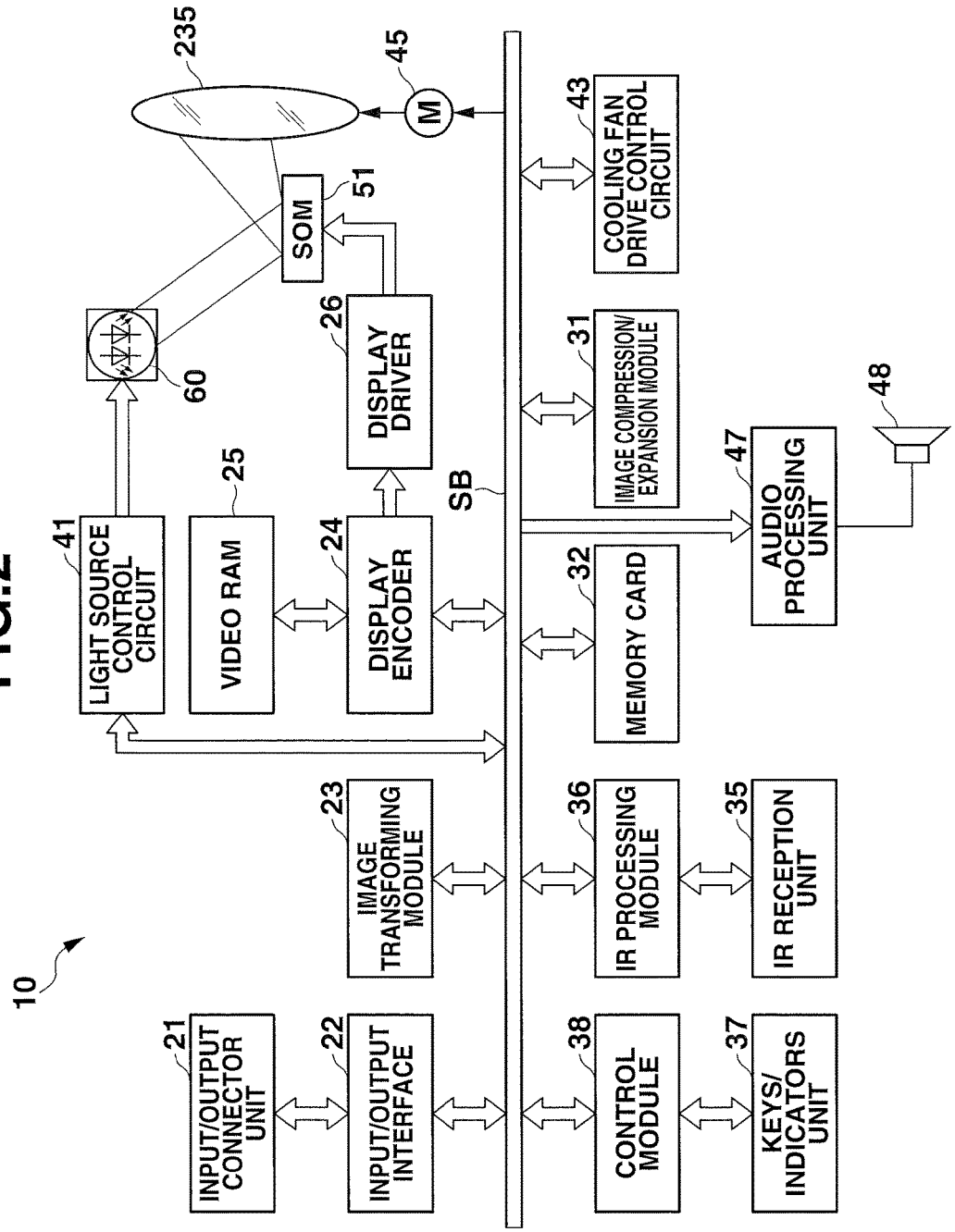
FIG. 2 is a diagram showing functional blocks of the projector according to the embodiment of the invention.

Next, a projector control unit of the projector 10 will be described by the use of a functional block diagram shown in FIG. 2. The projector control unit includes a control module 38, an input/output interface 22, an image transforming module 23, a display encoder 24 and a display driver 26.

This control module 38 controls respective operations of circuitries within the projector 10 and is made up of a CPU, a ROM which stores in a fixed fashion operation programs of various types of settings and a RAM which is used as a working memory.

Image signals of various standards which are inputted from the input/output connector unit 21 are sent via the input/output interface 22 and a system bus (SB) to the image transforming module 23 where the image signals are transformed so as to be unified into an image signal of a predetermined format which is suitable for display by the projector control unit. Thereafter, the image signals so transformed are outputted to the display encoder 24.

The display encoder 24 deploys the image signals that have been inputted thereinto on a video RAM 25 for storage therein and generates a video signal from the contents stored in the video RAM 25, outputting the video signal so generated to the display driver 26.

The display driver 26 functions as a display device control device and drives a display device 51, which is a spatial optical modulator (SOM) at an appropriate frame rate according to the image signal outputted from the display encoder 24. A pencil of light that is emitted from a light source unit 60 is shone onto the display device 51 via a light source-side optical system, whereby an optical image is formed by using reflected light that is reflected by the display device 51. The image so formed is then projected on to a screen, not shown, via a projection-side optical system. In addition, a movable lens group 235 of the projection-side optical system is driven by a lens motor 45 for zooming or focusing.

An image compression/expansion module 31 performs a recording operation in which a luminance signal and a color difference signal of an image signal are data compressed through ADCT and Huffman coding processes and the compressed data is sequentially written on a memory card 32 which is configured as a detachable recording medium.

When in a reproducing mode, the image compression/expansion module 31 performs the following operation. Specifically, the image compression/expansion module 31 reads out image data recorded on the memory card 32 and expands individual image data which make up a series of dynamic images frame by frame. Then, the image compression/expansion module 31 outputs the image data to the display encoder 24 via the image transforming module 23 so as to enable the display of dynamic images based on the image data stored on the memory card 32.

Operation signals which are generated at the keys/indicators unit 37 which includes the main keys and indicators which are provided on the upper panel 11 of the housing of the projector 10 are sent out directly to the control module 38. Key operated signals from the remote controller are received by the IR reception unit 35, and a code signal demodulated at an IR processing module 36 is outputted to the control module 38.

In addition, an audio processing unit 47 is connected to the control module 38 via the system bus (SB). This audio processing module 47 includes a circuitry for a sound source such as a PCM sound source. When in a projection mode and a reproducing mode, the audio processing unit 47 converts audio data into analog signals and drives a speaker 48 so as to output loudly sound or voice based on the audio data.

The control module 38 controls a light source control circuit 41 which is configured as a light source control unit. This light source control circuit 41 controls individually a red, green and blue light source devices of the light source unit 60 to emit light in the red, green and blue wavelength ranges so that the light in the predetermined ranges of wavelengths which are required in producing an image are emitted from the light source unit 60.

Further, the control module 38 causes a cooling fan drive control circuit 43 to detect temperatures through a plurality of temperature sensors which are provided in the light source unit 60 so as to control the rotating speed of cooling fans based on the results of the temperature detections. Additionally, the control module 38 also causes the cooling fan drive control circuit 43 to keep the cooling fan rotating even after the power supply to a projector main body is switched off by use of a timer or the like. Alternatively, the control module 38 causes the cooling fan drive control circuit 43 to cut off the power supply to the projector main body of the projector 10 depending upon the results of the temperature detections by the temperature sensors.

Figure 3:
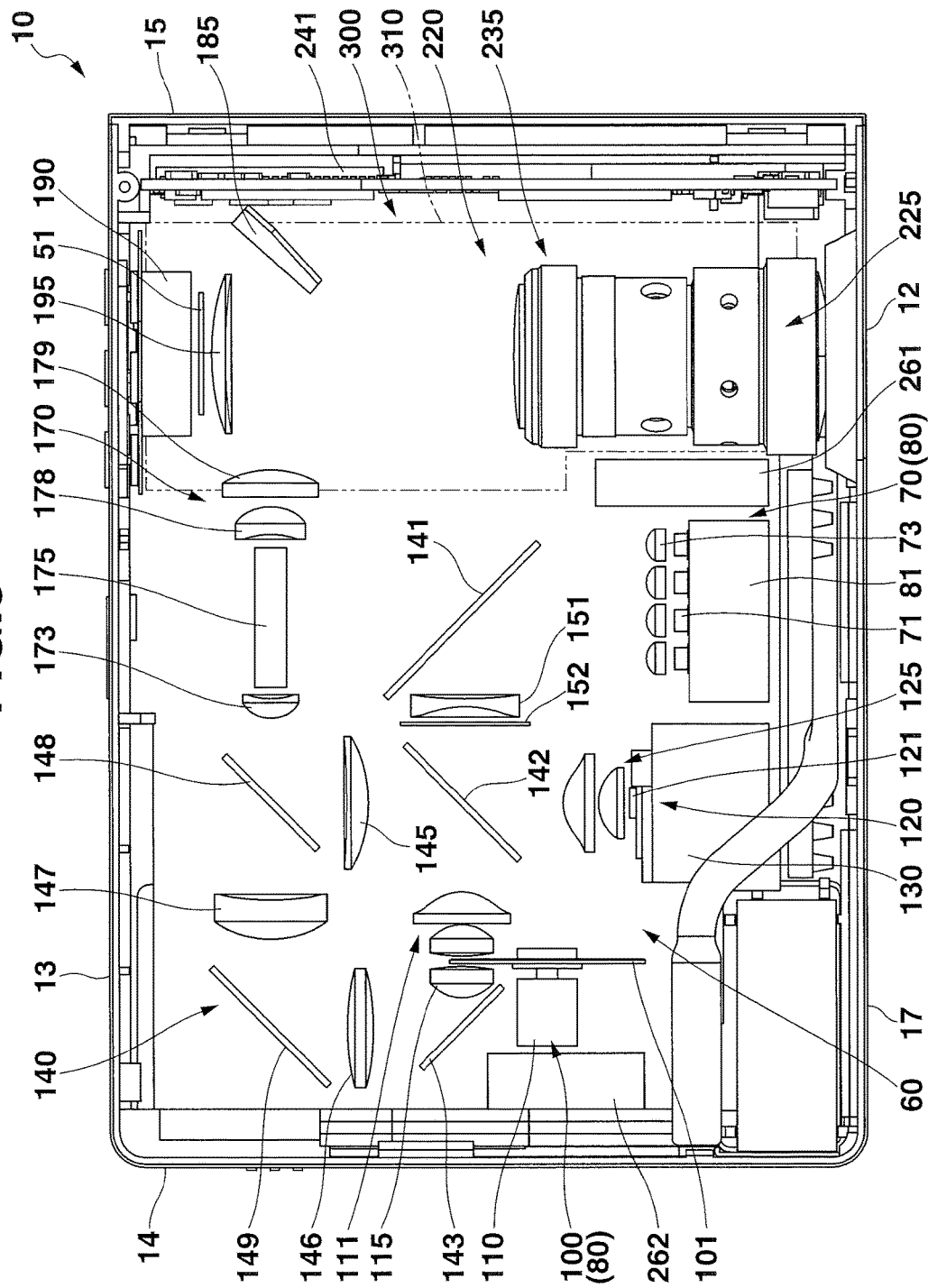
FIG. 3 is a schematic plan view showing an internal construction of the projector according to the embodiment of the invention.

Next, an internal construction of the projector 10 will be described based on FIG. 3. FIG. 3 is a schematic plan view showing an internal construction of the projector 10. The projector 10 includes a control circuit board 241 which is provided near the left side panel 15. This control circuit board 241 includes a power supply circuit block and a light source control block. A display device unit 300 which is an electronic control unit including the display device 51, which is made up of the DMDS, and a heat sink 190 which is a heat dissipating device for cooling the display device 51 is disposed on a side of the control circuit board 241 which faces the right side panel 14. The projector 10 includes the light source unit 60 which is provided at a front rightward portion of the housing of the projector 10. Further, the projector 10 includes a light source-side optical system 170 which is disposed between the light source unit 60 and the back panel 13. A projection-side optical system 220 is disposed at a portion of the housing of the projector 10 which lies on a side of the projector 10 which faces the left side panel 15.

The light source unit 60 includes an excitation light shining device 70, a red light source device 120 and a green light source device 80. The excitation light shining device 70 functions an excitation light source as well as a light source of light in the blue wavelength range. The red light source device 120 constitutes a light source of light in the red wavelength range, and the green light source device 80 constitutes a light source of light in the green wavelength range. The green light source device 80 is made up of the excitation light shining device 70 and a luminescent plate device 100. The light source unit 60 also includes a light guiding optical system 140 for guiding to emit light in the red, green and blue wavelength ranges. The light guiding optical system 140 collects light in the red wavelength range, light in the green wavelength range and light in the blue wavelength range which are emitted from the red, green and blue light sources, respectively, to an entrance port of a light tunnel 175.

The excitation light shining device 70 is disposed at a front and substantially central portion of the housing of the projector 10 which lies near the front panel 12. The excitation light shining device 70 includes a plurality of blue laser diodes 71 which are semiconductor light emitting elements, and these blue laser diodes 71 are provided so that optical axes thereof become parallel to the right side panel 14 and the left side panel 15. A heat sink 81 is provided on a side of the blue laser diodes 71 which faces the front side panel 12. In this embodiment, the excitation light shining device 70 includes a total of eight blue laser diodes 71 which are arranged in two rows and four columns.

A plurality of collimator lenses 73 are disposed individually on the optical axes of the blue laser diodes 71, and these collimator lenses 73 transform light emitted individually from the blue laser diodes 71 into parallel light so as enhance the directionality of the light so emitted.

The red light source device 120 is disposed side by side on a right-hand side of the excitation light shining device 70 so that an axis of light in the red wavelength range which is emitted from the red light source device 120 intersects axes of light in the blue wavelength range which is emitted from the excitation light shining device 70 to be reflected on a first reflecting mirror 141 and light in the green wavelength range which is emitted from a luminescent plate 101. The red light source device 120 includes a red light source 121 and a collective lens group 125. The red light source 121 is disposed so that the optical axis thereof becomes parallel to the optical axes of the blue laser diodes 71, and the collective lens group 125 collects light emitted from the red light source 121. The red light source device 121 is a red light emitting diode which is a semiconductor light emitting element which emits light in the red wavelength range.

The red light source device 120 includes a heat sink 130 which is disposed on a side of the red light source 121 which faces the front panel 12. On the other hand, a cooling fan 261 is disposed on a left-hand side of the excitation light shining device 70. Cooling are from this cooling fan 261 is sent to the heat sink 81 of the excitation light shining device 70 and the heat sink 130 of the red light source device 120, whereby the blue laser diodes 71 and the red light source 121 are cooled by the heat sink 81 and the heat sink 130, respectively.

The luminescent plate device 100 which makes up the green light source device 80 is disposed on an optical path of excitation light which is emitted from the excitation light shining device 70 to be reflected on the first reflecting mirror 141 and near the right side panel 14. The luminescent plate device 100 includes a luminescent plate 101, a motor 110, a collective lens group 111, and a collective lens 115. The luminescent device 100 is a luminescent wheel and is disposed so as to be parallel to the right side panel 14, that is, so as to be parallel to an axis of light emitted from the excitation light shining device 70. The motor 110 drives to rotate the luminescent plate 101. The collective lens group 111 collects a pencil of excitation light which is emitted from the excitation light shining device 70 and is then reflected by the first reflecting mirror 141 to the luminescent plate 101 and also collects a pencil of light which is emitted from the luminescent plate 101 in the direction of the left side panel 15. The collective lens 115 collects a pencil of light which is transmitted through the luminescent plate 101 or is transmitted therethrough while being diffused. A cooling fan 262 is disposed on aside of the motor 110 which faces the right side panel 14, and the luminescent plate device 100 is cooled by this cooling fan 262.

The luminescent plate 101 includes a luminous light emitting area and an excitation light transmission or diffuse transmission area which are disposed end to end continuously in a circumferential direction. The luminous light emitting area receives light emitted from the excitation light shining device 70 via the collective lens group 111 as excitation light and emits luminous light in the green wavelength range. The excitation light transmission or diffuse transmission area transmits or transmits diffusibly excitation light which is light emitted from the excitation light shining device 70.

A base material for the luminescent plate 101 is a metallic material which is made of copper or aluminum. An annular groove is formed on a surface of the base material which faces the excitation light shining device 70, and a bottom portion of the groove is mirror finished through silver deposition. A layer of a green luminescent material is laid on the mirror finished surface. Further, in the event that the excitation light transmission or diffuse transmission area is made into a transmission area, a transparent material having transparency is fitted in a light transmitting cutout portion in the base material. In the event that the excitation light transmission or diffuse transmission area is made into a diffuse transmission area, a transparent material having minute irregularities formed on a surface thereof through sandblasting is fitted in the light transmitting cutout portion.

In the luminescent material layer of the luminescent plate 101, when light in the blue wavelength range is shone from the excitation light shining device 70 on to the green luminescent material layer of the luminescent plate 101 as excitation light, the green luminescent material in the green luminescent material layer is excited, and light in the green wavelength range is emitted in every direction from the green luminescent material. A pencil of luminous light is emitted towards the left side panel 15 to be incident on the collective lens group 111. On the other hand, light in the blue wavelength range which is emitted from the excitation light shining device 70 to be incident on the area where incident light on the luminescent plate 101 is transmitted or transmitted diffusibly is transmitted or transmitted diffusibly through the luminescent plate 101 and is then incident on the collective lens 115 which is disposed on a back side (in other words, a side facing the right side panel 14) of the luminescent plate 101.

The light guiding optical system 140 includes collective lenses which collect pencils of light in the red, green and blue wavelength ranges, reflecting mirrors which change directions of axes of the pencils of light in the red, green and blue wavelength ranges so that the pencils of red, green and blue light are directed in the same direction, and dichroic mirrors. Specifically speaking, the light guiding optical system 140 includes a first reflecting mirror 141, a collective lens 151, a diffusing plate 152, a first dichroic mirror 142, a second reflecting mirror 143, a collective lens 146, a third reflecting mirror 149, a collective lens 147, a collective lens 145, and a second dichroic mirror 148.

The first reflecting mirror 141 is disposed on a side of the excitation light shining device 70 which races the back panel 13. The first reflecting mirror 141 changes the direction of an axis of light in the blue wavelength range which is emitted from the excitation light shining device 70 through 90 degrees in the direction of the right side panel 14.

The collective lens 151 is disposed on a side of the first reflecting mirror 141 which faces the right side panel 14. The diffusing plate 152 is disposed on a side of the collective lens 151 which faces the right side panel 14. Excitation light reflected by the first reflecting mirror 141 is collected by the collective lens 151 and is then diffused by the diffusing plate 152.

The first dichroic mirror 141 is disposed in a position where light in the blue wavelength range which is transmitted diffusibly through the diffusing plate 152 and light in the green wavelength range which is emitted from the luminescent plate 101 intersect light in the red wavelength range which is emitted from the red light source device 120. The first dichroic mirror 141 transmits light in the blue wavelength range and light in the red wavelength range and reflects light in the green wavelength range and changes the direction of an axis of the light in the green wavelength range through 90 degrees the direction of the back panel 13.

The second reflecting mirror 143 is disposed on the axis of the light in the blue wavelength range which is transmitted or transmitted diffusibly through the luminescent plate 101, that is, between the collective lens 115 and the right side panel 14. The second reflecting mirror 143 changes the direction of the axis of the light in the blue wavelength range through 90 degrees in the direction of the back panel 13. The collective lens 146 is disposed on a side of the second reflecting mirror 143 which faces the back panel 13, and the third reflecting mirror 149 is disposed on a side of the collective lens 146 which faces the back panel 13. The collective lens 147 is disposed on a side of the third reflecting mirror 149 which faces the left side panel 15. The third reflecting mirror 149 changes the direction of the axis of the light in the blue wavelength range which is reflected by the second reflecting mirror 143 and is then incident on the third reflecting mirror 149 through 90 degrees in the direction of the left side panel 15.

The collective lens 145 is disposed on a side of the first dichroic mirror 142 which faces the back panel 13. Further, the second dichroic mirror 148 is disposed on a side of the collective lens 145 which faces the back panel 13 and on a side of the collective lens 147 which faces the left side panel 15. The second dichroic mirror 148 reflects light in the red wavelength range and light in the green wavelength range to change the direction of axes of the red light and the green light through 90 degrees in the direction of the left side panel 15 and transmits the light in the blue wavelength range which is incident on the second dichroic mirror 148 via the collective lens 147.

The axis of the light in the red wavelength range which is transmitted through the first dichroic mirror 142 and the axis of the light in the green wavelength range which is reflected by the first dichroic mirror 142 so that the direction of the axis thereof coincides with the direction of the axis of the light in the red wavelength range are directed to the collective lens 145, and the light in the red wavelength range and the light in the green wavelength range are incident on the collective lens 145. Then, the light in the red wavelength range and the light in the green wavelength range which are transmitted through the collective lens 145 are reflected by the second dichroic mirror 148 and are then collected to the incident port of the light tunnel 175 via a collective lens 173 of the light source-side optical system 170. On the other hand, the light in the blue wavelength range which is transmitted through the collective lens 147 is transmitted through the second dichroic mirror 148 and is collected to the incident port of the light tunnel 175 via the collective lens 173.

The light source-side optical system 170 includes the collective lens 173, the light tunnel 175, a collective lens 178, a collective lens 179, a light shining mirror 185, and a condenser lens 195. The condenser lens 195 also constitutes part of the projection-side optical system 220 because the condenser lens 195 emits image light which is emitted from the display device 51 which is disposed on a side of the condenser lens 195 which faces the back panel 13 towards a fixed lens group 225 and the movable lens group 235.

The collective lens 173 is disposed between the light tunnel 175 and the second dichroic mirror 148, and the collective lens 173 collects light source light to the incident port of the light tunnel 175. Thus, the light in the red wavelength range, the light in the green wavelength range and the light in the blue wavelength range are collected by the collective lens 173 to be incident on the light tunnel 175. The pencil of light that enters the light tunnel 175 is made into a pencil of light whose luminous intensity is uniformly distributed by the light tunnel 175.

The collective lenses 178, 179 are disposed on an optical axis of the light tunnel 175 on a side thereof which faces the left side panel 15. A pencil of light emitted from the light tunnel 175 is shone on to the light shining mirror 185 via the collective lenses 178, 179 and is then shone onto the display device 51 at a predetermined angle via the condenser lens 195 by the light shining mirror 185. The heat sink 190 is disposed on a side of the display device 51, which is made up of the DMDs, which faces the back panel 13, and the display device 51 is cooled by the heat sink 190. The optical parts such as the display device 51, the heat sink 190, the condenser lens 195, the collective lens 178, the light shining mirror 185 and the projection-side optical system 220 are held to the display device unit 300 by means of a holding member 310.

The pencil of light, which is the light source light shone on to an image forming plane of the display device 51 by the light source-side optical system 170, is reflected on the image forming plane of the display device 51 and is then projected to a screen via the projection-side optical system 220 as projected light. Here, the projection-side optical system 220 is made up of the condenser lens 195, the movable lens group 235 and the fixed lens group 225. The movable lens group 235 can be moved by the lens motor. The movable lens group 235 and the fixed lens group 225 are incorporated in a fixed lens barrel. Consequently, the fixed lens barrel including the movable lens group 235 is made into a variable focus lens which enables zooming and focusing adjustments.

By configuring the projector 10 in the way described above, when light is emitted from the excitation light shining device 70 and the red light source device 120 at different timings while rotating the luminescent plate 101, light in the red wavelength range, light in the green wavelength range and light in the blue wavelength range are sequentially incident on the collective lens 173 and the light tunnel 175 via the light guiding optical system 140 and are then incident on the display device 51 via the light source-side optical system 170. Then, the DMDs making up the display device 51 display the red light, the green light and the blue light in a time sharing fashion, whereby a color image can be projected on to the screen.

Figure 4:
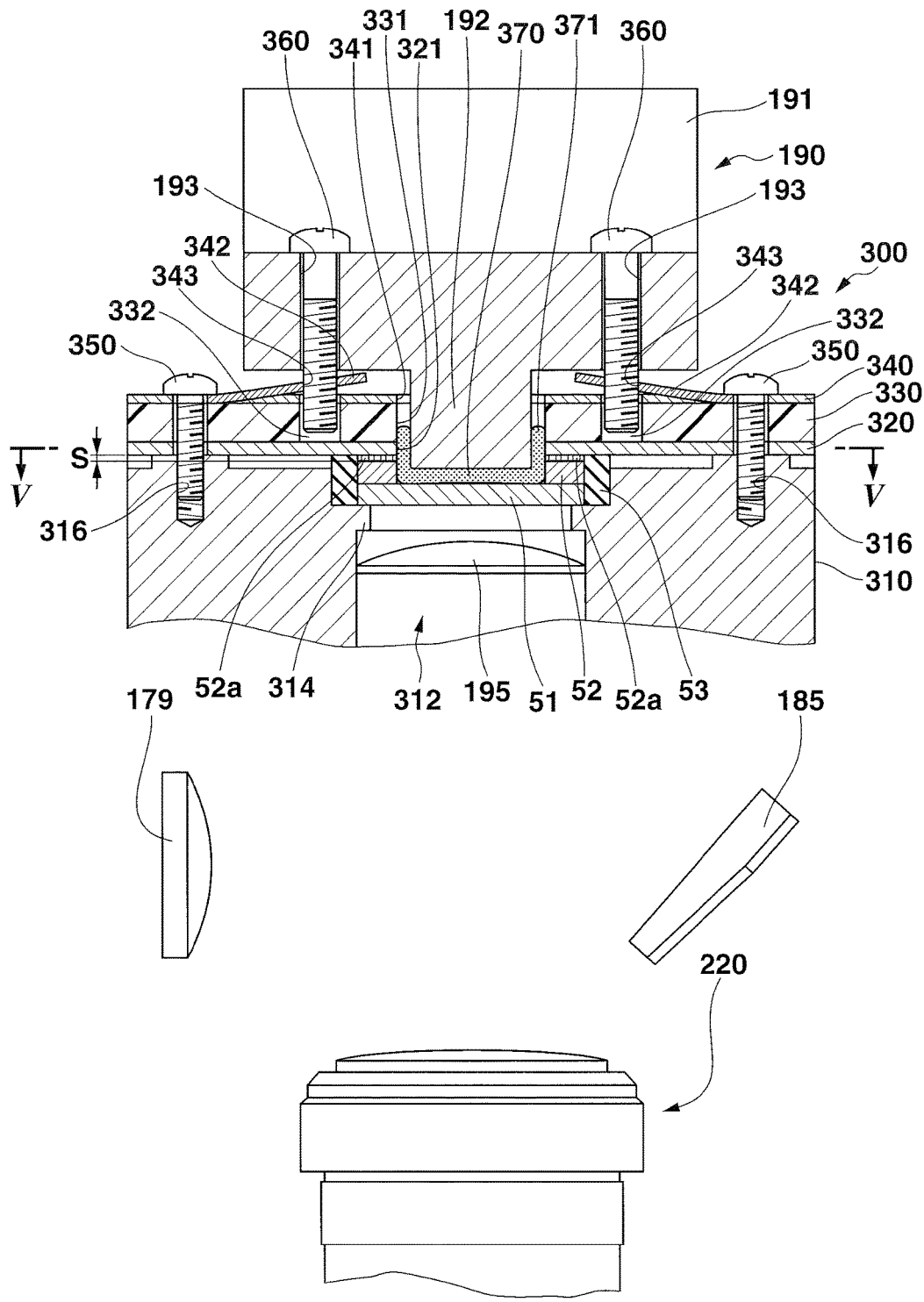
FIG. 4 is a schematic diagram showing a section of a part of a display device according to the embodiment of the invention.

Next, the display device unit 300 which is an electronic unit will be described. As shown in FIG. 4, the display device 51, which is an electronic part, the heat sink 190 which is a heat dissipating device, the condenser lens 195, the collective lens 179, the light shining mirror 185 and the projection-side optical system 220 are integrally held to the display device unit 300 by the holding member 310. In FIG. 4, only a portion where the holding member 310 holds the display device 51 and the heat sink 190 is shown in cross section.

An optical path space 312 is formed at a center of the holding member 310. The condenser lens 195 is held in the optical path space 312. On the other hand, a substrate 320 is provided on a rear end surface of the holding member 310. A rectangular opening portion 321 which is elongated in a left-to-right direction is formed in a center of the substrate 320 (refer to FIG. 5). The heat sink 190 is disposed on one side of the substrate 320 which is a side facing the back panel 13 (that is, a back side) in FIG. 3. The display device 51 is disposed on the other side of the opening portion 321 of the substrate 320 which is a side facing the front panel 12 (that is, a front side) in FIG. 3. Micromirrors are disposed on a front surface of the display device 51, and a back surface of the display device 51 is made into a heat dissipating surface.

An abutment surface which is an edge portion of the front surface of the display device 51 is brought into abutment with a step portion 314, having a frame shape when seen from the front, which is formed at the optical path space 312 on a back side of the condenser lens 195. A socket 52 for the display device 51, having a frame shape when seen from the front, is connected to an edge portion of a back surface of the display device 51. The socket 52 is disposed at an edge portion of a front surface of the opening portion 321 of the substrate 320. A connection terminal 52a is provided on a back surface of the socket 52 so as to project therefrom. This connection terminal 52a is electrically connected to the substrate 320. Consequently, the back surface of the socket 52 is spaced apart by a predetermined space S equal to a length of the connection terminal 52a from a front surface side of the substrate 320. In this way, the socket 52 constitutes a connecting portion between electronic parts which enables the display device 51 to be electrically connected to the substrate 320.

A rubber cushion 53 having a frame shape is provided on an outer circumference of the display device 51 and the socket 52 between the step portion 314 and the substrate 320. This rubber cushion 53 is configured to prevent the intrusion of dust into the space S from an outer circumferential side.

A spacer 330 containing aluminum is provided on a back surface side of the substrate 320. A metallic plate member 340 is provided on a back surface side of the spacer 330. Bolts 350 are inserted through bolt hole portions formed in the metallic plate member 340, the spacer 330 and the substrate 320. Specifically, two bolts 350 are screwed individually into two left and right internally threaded portions 316 which are formed in the holding member 310. Consequently, the metallic plate member 340, the spacer 330 and the substrate 320 are fixed to the holding member 310. Opening portions 331, 341, both having the same shape as the shape of the opening portion 321 of the substrate 320, are formed in central portions of the spacer 330 and the metallic plate member 340, respectively.

On the other hand, the heat sink 190, which is a heat dissipating device, has a plurality of fins 191 which are formed on a back surface thereof to constitute a heat dissipating portion. In FIG. 4, the plurality of heat dissipating fins 191 are arranged from a near side towards a far side. Consequently, a plurality of grooves 191a (refer to FIG. 9) which are defined between the heat dissipating fins 191 extend in a left-to-right direction in FIG. 4.

Figure 5:
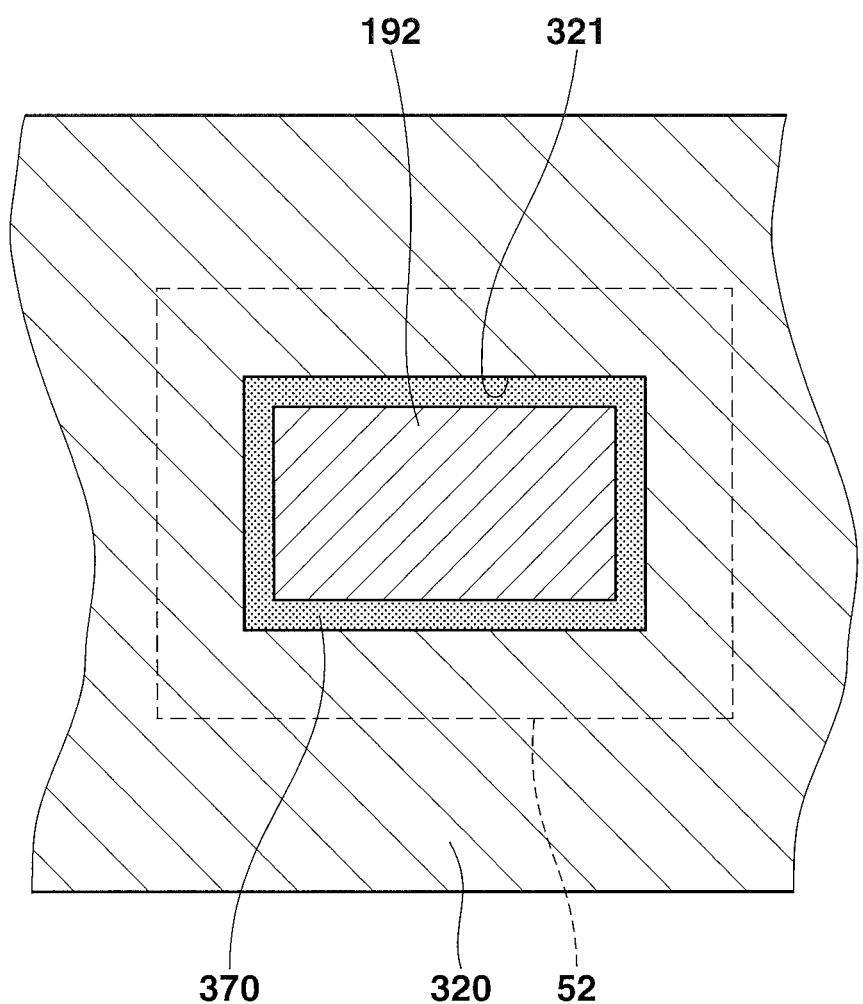
FIG. 5 is a sectional view of the display device according to the embodiment of the invention which is taken along a line V-V in FIG. 4.

A projecting heat transfer portion 192 is formed on a front surface side of the heat sink 190. The heat transfer portion 192 has a rectangular cross section when seen from the front, as shown in FIG. 5. As shown in FIG. 4, the heat transfer portion 192 has a predetermined size which enables the heat transfer portion 192 to be inserted into the opening portions 321, 331, 341. On the other hand, the plurality of heat dissipating fins 191 are formed so as to be long in the left-to-right direction in FIG. 4. Consequently, the heat sink 190 can be formed through extrusion.

A plate spring portion 342 is formed on either of left- and right-hand side of the metallic plate member 340. An internally threaded portion 343 is formed in each plate spring portion 342. Bolts 360 are inserted individually through two left and right bolt holes 193 formed in the heat sink 190. The bolts 360 are screwed through the internally threaded portions 343 of the plate spring portions 342, whereby the heat sink 190 is fixed to the metallic plate member 340 and is biased towards the display device 51 placed on a front surface side thereof by means of a biasing force of the plate spring portions 342 which each function as a biasing device.

Distal end portions of the bolts 360 are positioned in hole portions 332 formed in the spacer 330. This prevents the interference of distal ends of the bolts 360 with the back surface of the substrate 320.

As shown in FIGS. 4, and 5, too, a heat conductive member 370 made of a heat conductive putty is provided between an outer circumference of the heat transfer portion 192 of the heat sink 190 and an inner circumference of the socket 52 and between a distal end face of the heat transfer portion 192 and the back surface of the display device 51. An end portion 371 of the heat conductive member 370 between the heat transfer portion 192 and the inner circumference of the socket 52 is positioned closer to one surface side (that is, to the heat sink 190) than the gap S defined between the substrate 320 and the socket 52. In this embodiment, the end portion 371 of the heat conductive member 370 reaches a portion of an inner circumferential surface of the opening portion 331 of the spacer 330. Namely, a gap between the outer circumference of the heat transfer portion 192 and an inner circumference of the opening portion 321 is sealed up by the heat conductive member 370.

The heat conductive member 370 has heat conductivity, flame retardant properties and electrical insulating properties and is a clay-like material with low hardness which is made mainly from silicon. Consequently, the heat conductive member 370 can be deformed plastically with ease when a low load is exerted thereon and has high adhesion properties. Consequently, the outer circumference of the heat transfer portion 192 of the heat sink 190 and the inner circumference of the socket 52 and the distal end face of the heat transfer portion 192 and the back surface of the display device 51 are allowed to adhere to each other via the heat conductive member 370.

The display device 51 of the display device unit 300 which is formed in the way described above generates heat when the projector 10 is driven. Then, the heat generated by the display device 51 is transferred from the heat dissipating surface on the back side of the display device 51 to the heat transfer portion 192 via the heat conductive member 192. Then, the heat transferred to the heat transfer portion 192 is dissipated by the plurality of heat dissipating fins 191 of the heat sink 190.

Outside air is taken in by the cooling fans 261, 262 (refer to FIG. 3), flows through an interior of the projector 10 and is discharged outside while the projector 10 is in operation. As this occurs, even in an normal utilization environment, outside air so taken into the projector 10 contains dust. No sealing is provided to an abutment portion where the abutment surface of the edge portion on the front surface side of the display device 51 is brought into abutment with the back surface of the step portion 314. However, the rubber cushion 53 eliminates a risk of dust in the outside air reaching the plurality of micromirrors on the front surface side of the display device 51 for adhesion thereto from an outer circumference of the display device 51 via the abutment portion where the display device 51 is in abutment with the step portion 314.

Further, the gap S defined between the socket 52 and the substrate 320 is closed tightly by the heat conductive member 370. Here, let's suppose that dust intrudes into the gap S from the opening portion 321. The dust will adhere to the plurality of micromirrors on the front surface side of the display device from the outer circumferences of the socket 52 and the display device 51 via the abutment portion where the display device 51 is in abutment with the step portion 314. However, the gap S is tightly closed by the heat conductive member 370. Consequently, the dust is prevented from intruding into the gap S from the opening portion 321.

It is noted that the display device 51 and the socket 52 are deformed minutely by the heat generated by the display device 51. Consequently, the outer circumference of the display device 51 and the socket 52 are not in tight contact with the rubber cushion 53. Thus, although the rubber cushion 53 is disposed in the position where the rubber cushion 53 covers the gap S from an outer circumferential side of the socket 52, it is difficult to prevent the intrusion of the dust from the gap S.

In addition, the holding member 310 is large enough compared with the display device 51, and therefore, the holding member 310 is deformed little by the heat generated by the display device 51. Consequently, the holding member 310 and the substrate 320 are kept in tight contact with the rubber cushion 53, whereby the intrusion of dust from the outside of the rubber cushion 53 is prevented.

Figure 6:
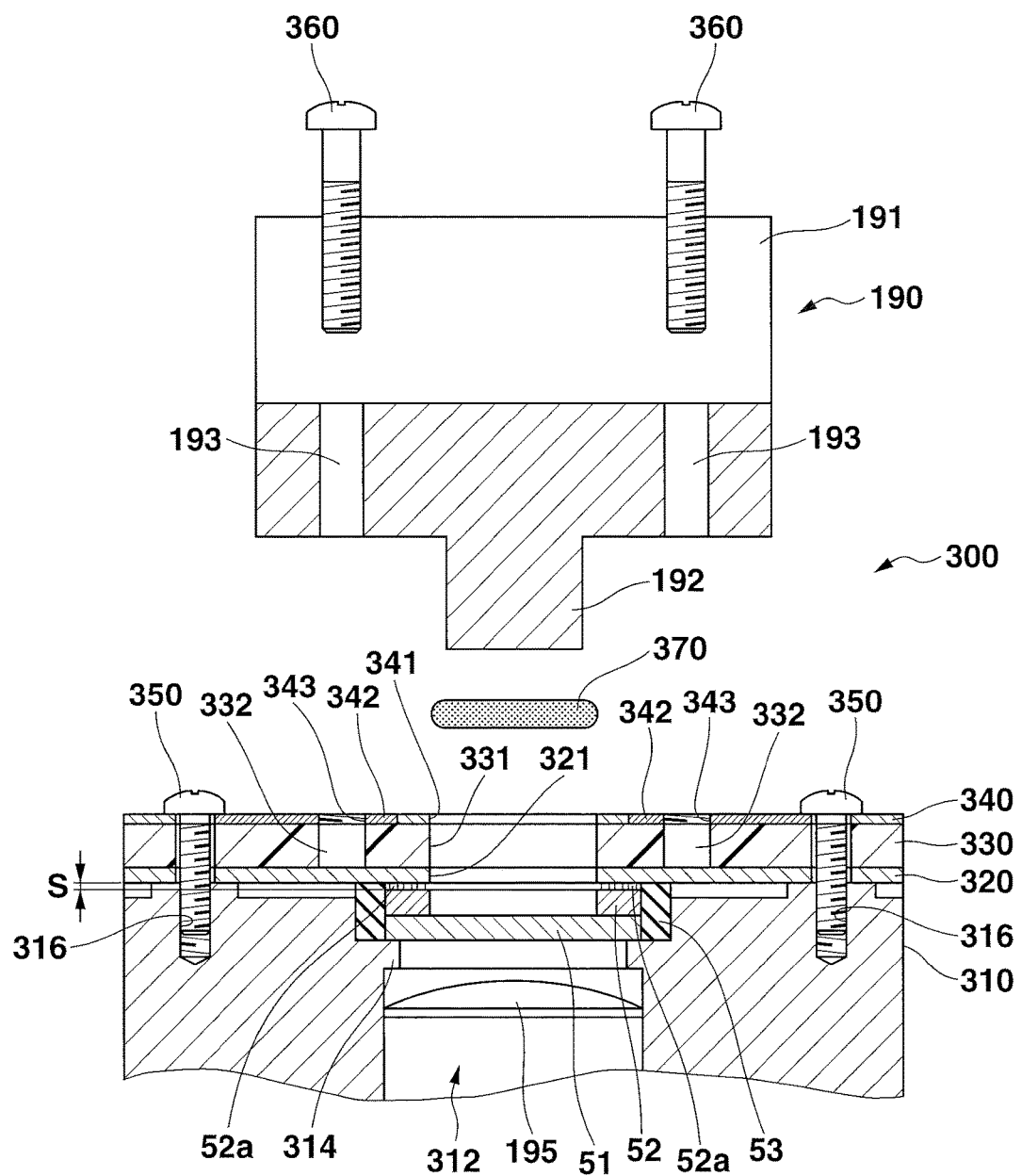
FIG. 6 is a sectional view showing an assembling process of the display device according to the embodiment of the invention.
Figure 7:
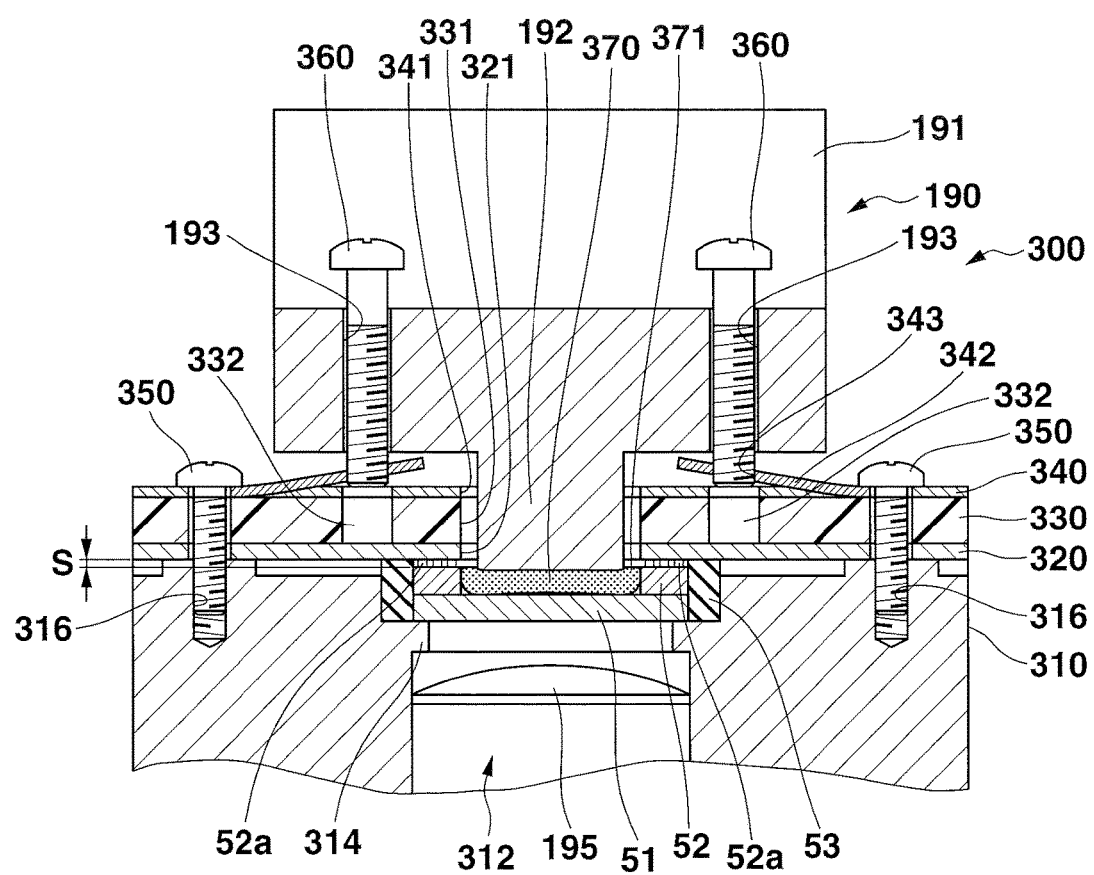
FIG. 7 is a sectional view showing the assembling process of the display device according to the embodiment of the invention.

Next, a fabrication method of the display device unit 300 will be described based on FIGS. 6 and 7. This fabrication method includes a step of disposing the substrate 320 having the opening portion 321 and the heat dissipating surface of the display device 51 which is the electronic part which is connected to the substrate 320 via the socket 52 which is the frame-shaped connecting portion disposed with the gap defined between the substrate 320 and itself so as to face each other and fixing them in position, a step of placing the sheet-shaped heat conductive member 370 having a predetermined thickness on the heat dissipating surface of the display device 51, and a step of inserting the projecting heat transfer portion 192 of the heat dissipating device 190 into the opening portion 321 and plastically deforming the heat conductive member 370 so that the end portion of the heat conductive member 370 is positioned closer to the heat dissipating device 190 than the gap S defined between the socket 52 and the substrate 320.

Specifically speaking, the fabrication of the display device unit 300 will be carried out according to the fabrication method as follows. Firstly, the display device 51 is placed on the step portion 314 of the holding member 310. As this occurs, the display device 51 is placed on the step portion 314 so that the heat dissipating surface on the back side of the display device 51 faces the heat sink 190. Then, the rubber cushion 53 is disposed on the outer circumference of the display device. Next, the substrate 320 in which the socket 52 is connected to the edge portion of the front surface side thereof is disposed at a rear end of the holding member 310 so that the display device 51 is connected to the socket 52. Thereafter, the spacer is disposed on the back surface side of the substrate 320, and the metallic plate member 340 is disposed on the back surface side of the spacer 330. Then, as shown in FIG. 6, the bolts 350 are screwed into the internally threaded portions 316 of the holding member 310, whereby the metallic plate member 340, the spacer 330 and the substrate 320 are fixed to the holding member 310.

Next, the sheet-shaped heat conductive member 370 is placed on the heat dissipating surface of the display device 51. For example, after the heat conductive member 370 having a thickness of about 2.0 mm is placed on the heat dissipating surface of the display device 51, the heat transfer portion 192 of the heat sink 190 is inserted into the opening portions 321, 331, 341 of the substrate 320, the spacer 330 and the metallic plate member 340 so that the distal end face of the heat transfer portion 192 is brought into abutment with the heat conductive member 370. Then, the bolts 360 are inserted through the hold holes 193 of the heat sink 190, and the bolts 360 are screwed into the internally threaded portions 343 of the plate spring portions 342 of the metallic plate member 340.

When the bolts 360 are tightened, the heat sink 190 is moved towards the front surface side while being biased towards the front surface side by the plate spring portions 342. Then, the heat conductive member 370 is loaded by the heat transfer portion 192, whereby the heat conductive member 370 is deformed plastically. When the heat conductive member 370 is plastically deformed, the heat conductive member 370 situated between the distal end face of the heat transfer portion 192 and the heat dissipating surface of the display device 51 is collapsed to be thin. As the heat conductive member 370 gets thinner, the heat conductive member 370 starts to be filled in accordingly between the outer circumference of the heat transfer portion 192 and the inner circumference of the socket 52 as shown in FIG. 7. Then, when the bolts 360 are tightened further, the heat conductive member 370 is disposed between the outer circumference of the heat transfer portion 192 and the inner circumference of the socket 52 and between the distal end face of the heat transfer portion 192 and the heat dissipating surface of the display device 51. The tightening operation of tightening the bolts 360 keeps carried out until the end portion 371 of the heat conductive member 370 is positioned closer to the heat sink 190 than the gap S defined between the socket 52 and the substrate 320 as shown in FIG. 4.

In the fabrication method, the display device 51 is placed on the holding member 310, and the substrate 320 and the like are disposed to be fixed to the holding member 310, whereafter the heat conductive member 370 is placed on the heat dissipating surface of the display device 51. However, the substrate 320 and the like may be disposed to be fixed to the holding member 310 after the heat conductive member 370 is placed on the heat dissipating surface of the display device 51, provided that the socket 52 is connected to the display device 51 before the substrate 320 is disposed on the holding member 310.

Figure 8A:
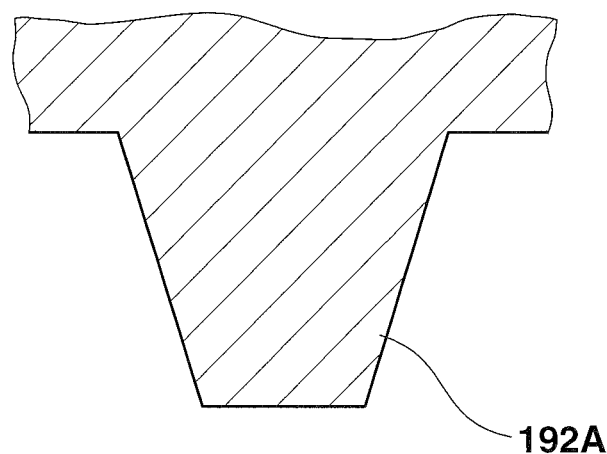
FIGS. 8A to 8C are sectional views showing modified examples of a heat transfer portion according to the embodiment of the invention.
Figure 8B:
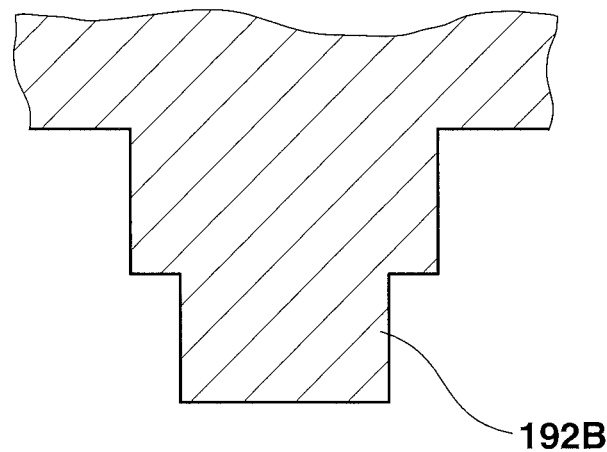
Figure 8C:
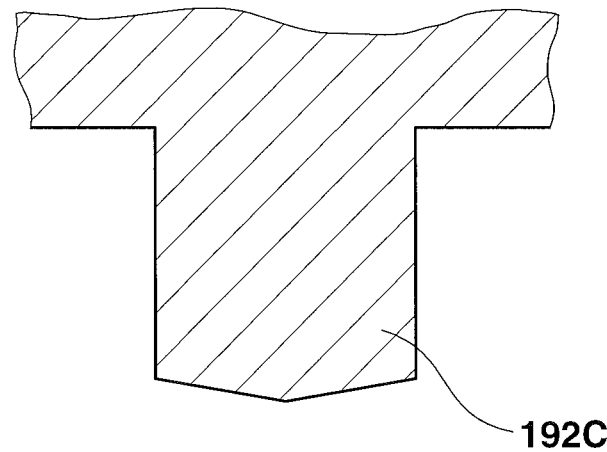

The heat transfer portion 192 of the heat sink 190 can take various shapes to close tightly the gap S depending on the hardness of the heat conductive member 370 and the size of the heat dissipating surface of the display device 51. Here, FIGS. 8A to 8C show sectional views of heat transfer portions 192A, 192B, 192C, respectively, as seen from a left or right side of FIG. 4. For example, the heat transfer portion 192A shown in FIG. 8A has a trapezoidal shape which expands obliquely as it extends towards a proximal end (that is, towards the heat dissipating fins 191) thereof. Then, in this heat transfer portion 192A, the trapezoidal shape is formed continuously in the longitudinal direction (that is, in the left-to-right direction).

The heat transfer portion 192B shown in FIG. 8B has a shape in which two elongated rectangles which differ in size are superposed on each other in two stages in section. Specifically, the heat transfer portion 192B has a shape in which longer sides of a proximal elongated rectangle is longer than longer sides of a distal elongated rectangle. In this heat transfer portion 192B, too, the elongated rectangles superposed on each other in the two stages are formed continuously in the longitudinal direction.

The heat transfer portion 192C shown in FIG. 8C has an obtuse-angled distal end portion in section. In this heat transfer portion 192C, too, the obtuse-angled distal end portion in section is formed continuously in the longitudinal direction.

Figure 9:
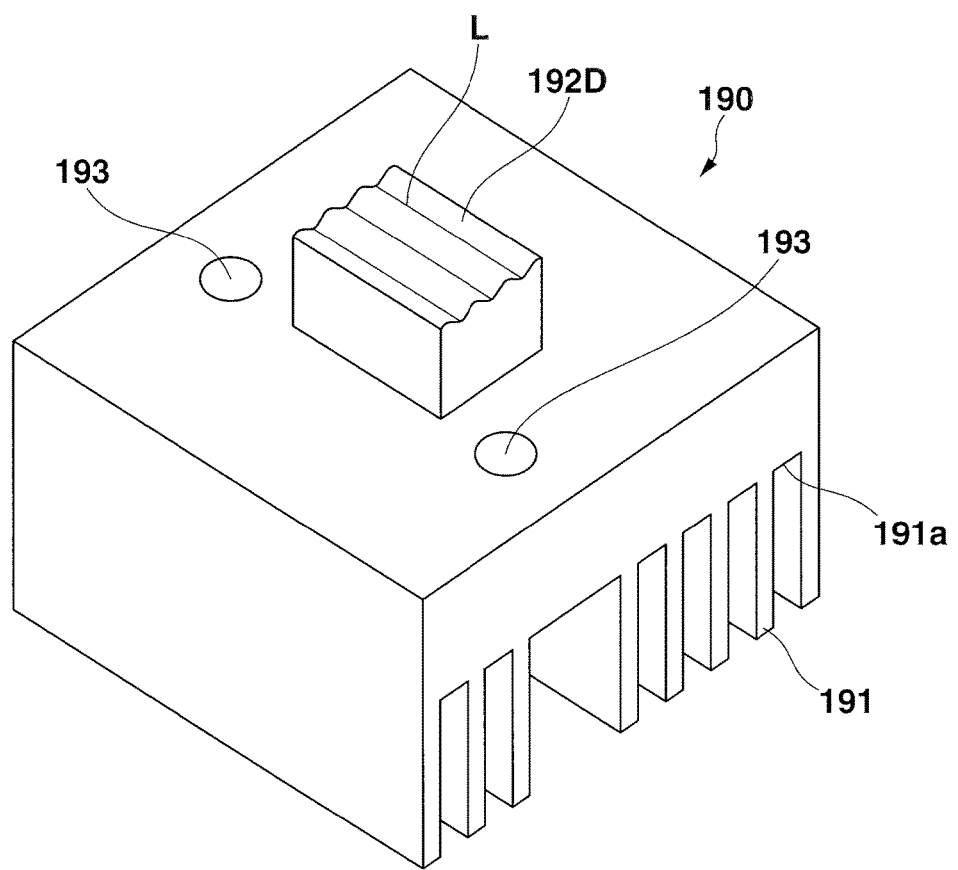
FIG. 9 is a perspective view of a heat dissipating device showing a modified example made to the heat transfer portion according to the embodiment of the invention.

Further, FIG. 9 shows a heat sink 190 having a heat transfer portion 192D. A distal end face of the heat transfer portion 192D has a waveform when seen from a side. In this heat transfer portion 192D, the waveform is formed continuously in the longitudinal direction. Furthermore, the direction of grooves 191a defined by a plurality of heat dissipating fins 191 coincides with the direction of roots L (or ridges) of the waveform when seen from the side. By adopting this configuration, the heat sink 190 having the heat conductive portion 192D can also be formed through extrusion.

As has been described heretofore, in the heat transfer portions 192A to 192D, the sectional shapes when seen from the side which are shown in FIGS. 8A to 8C and 9 are formed continuously. Further, in the heat transfer portion 192 of the embodiment described above, too, the section resulting when seen from the side is formed continuously. The direction of the grooves 191a which are defined by the plurality of heat dissipating fins 191 coincides with the direction in which the sections of the heat transfer portions 192, and 192A to 192D resulting when seen from the side are formed continuously (that is, in the left-to-right direction in FIG. 4). Consequently, the heat sinks 190D including the heat transfer portions 192, and 192A to 192D can be formed through extrusion.

In the case of the heat sinks 190 including the heat transfer portions 192A to 192D being formed through extrusion, an unnecessary longitudinal portion of each of the heat transfer portions 192A to 192D is removed through a cutting operation.

In anyone of the heat transfer portions 192A to 192D, the section resulting when seen from the front is formed into an elongated rectangular shape, as in the case with the heat transfer portion 192 shown in FIG. 5.

The display device unit 300 which is the electronic unit is configured in the way described above. However, the invention can also be applied to other electronic units including other electronic parts. For example, the invention can be applied to an electronic unit including a semiconductor light emitting device such as a semiconductor light emitting element such as a light emitting diode or a laser diode. As this occurs, the heat transfer portion can be given other shapes including a circular cylindrical shape so as to match the shape of the heat dissipating surface of the electronic part.

In this embodiment, the plate spring portions 342 are formed on the metallic plate member 340 as the biasing devices for biasing the heat sink 190 towards the front surface side, the invention is not limited thereto. Thus, coil springs configured to be wound around the bolts 360 can also be used as the biasing devices.

Thus, according to the embodiment of the invention, the heat transfer portions 192, 192A to 192D of the heat sinks 190 which are the heat dissipating devices are inserted into the opening portion 321 of the substrate 320. On the other hand, the display device 51 which is the electronic part is connected to the socket 52 which is the connecting portion so that the heat dissipating surface is positioned in the opening portion 321. Then, the socket 52 is connected electrically to the substrate with the gap S defined therebetween. The heat conductive member 370 is provided between the outer circumference of the heat transfer portions 192, 192A to 192D and the heat dissipating surface and the outer circumference of the transfer portions 192, 192A to 192D and the inner circumference of the socket 52. The end portion of the heat conductive member 370 is positioned closer to the heat sink 190 than the gap S defined between the socket 52 and the substrate 320.

By adopting this configuration, dust is prevented from flowing from the opening portion 321 into the gap S. Consequently, since the adhesion of dust to the surface of the display device 51 is reduced, the display device 51 which is the electronic part can keep exhibiting the predetermined performance continuously.

The heat transfer portions 192, 192A to 192D each have the elongated rectangular shape in section when seen from the front. By adopting this configuration, the heat conductive member 370 can be disposed at the distal end face of the heat transfer portion 192, 192A to 192D or on the outer circumference thereof so as to match the elongated rectangular electronic part, that is, the display device 51 of the embodiment, for example.

The heat dissipating portion of the heat sink 190 is formed of the plurality of heat dissipating fins 191. On the other hand, in the heat transfer portions 192, 192A to 192D, the sectional shape resulting when seen from the side is formed continuously along the longitudinal direction. The longitudinal direction of the heat transfer portion 192, 192A to 192D coincides with the direction in which the grooves 191a are defined by the plurality of heat dissipating fins 191, whereby the heat sinks 190 including the projecting heat transfer portions 192, 192A to 192D can be formed through extrusion. Thus, the electronic unit can be fabricated with good efficiency.

In the case of the heat transfer portion 192D being formed to have the waveform in section resulting when seen from the side, the surface area of the distal end face of the heat transfer portion 192 is increased, and therefore, the heat transfer portion 192D can transfer the heat from the heat dissipating surface of the display device 51 to the heat dissipating fins 191 with good efficiency. In addition, the various heat transfer portions 192, 192A to 192D can be selected.

The heat sink 190 is biased towards the display device 51 by the plate spring portions 342 which function as the biasing devices. By adopting this configuration, the distal end faces of the heat transfer portions 192, 192A to 192D can be secured tightly to the heat dissipating surface of the display device 51 in an ensured fashion, and therefore, the cooling efficiency of the display device 51 can be enhanced further.

The internally threaded portions 343 are provided in the plate spring portions 342 which function as the biasing devices, and the bolts 360 which are inserted through the heat sink 190 are screwed into the internally threaded portions 343. This facilitates the control of tightening torque with which the heat sink 190 is mounted, and the heat sink 190 can be biased by the metallic plate member 340 having the simple construction.

The heat conductive member 370 is formed by plastically deforming the sheet-shaped heat conductive member 370 by the heat transfer portions 192, 192A to 192D. This allows the heat conductive member 370 to be secured tightly to the portions where the heat conductive member 370 are supposed to contact with (the gap S or the outer circumference of the heat transfer portions 192, 192A to 192D) in an ensured fashion.

The projector 10 includes the display device unit 300 which is configured as the electronic unit, the light source unit 60 including the red, green and blue light source devices, the light source-side optical system 170, the projection-side optical system 220, and the projector control unit. By adopting this configuration, the adhesion of dust to the display device 51 of the projector 10 is reduced, and therefore, it is possible to provide the projector 10 which can reduce the deterioration in image quality which would otherwise be triggered by the dust adhering to the display device 51.

According to the fabrication method of the display device unit 300, the display device 51 is connected to the socket 52 which is connected to the substrate 320, the sheet-shaped heat conductive member is placed on the heat dissipating surface of the display device 51, and the heat conductive member 370 is plastically deformed by the heat transfer portion 192, 192A to 192D. By adopting this configuration, the assemblage of the heat sink 190 to the holding member 310 and the plastic deformation of the heat conductive member 370 can be performed at the same time. Thus, the display device unit 300 can be fabricated with good efficiency.

In the embodiment, the heat conductive member 370 is configured so that the heat conductive member such as the sheet-shaped heat conductive putty is placed on the heat dissipating surface of the display device 51 and is plastically deformed by the heat transfer portion 192, 192A to 192D. However, the invention is not limited thereto. A box-shaped heat conductive member having an opening portion formed in an upper surface in advance may be used as the heat conductive member.

The embodiment that has been described heretofore is presented as the example, and there is no intention to limit the scope of the invention by the embodiment. The novel embodiment can be carried out in various forms, and various omissions, replacements and modifications or alterations can be made to the embodiment without departing from the spirit and scope of the invention. The resulting embodiments and their modifications are included in the spirit and scope of the invention and are included in the scope of inventions claimed under claims and their equivalents.

What is claimed is:

1. An electronic unit comprising:
   a heat dissipating device comprising a projecting heat transfer portion;
   a substrate on one surface side of which the heat dissipating device is disposed and in which an opening portion where the projecting heat transfer portion of the heat dissipating device is inserted is formed by an inner circumference of the substrate;
   an electronic part which is disposed on the other surface side of the substrate;
   a frame-shaped connecting portion which connects a heat dissipating surface of the electronic part to the substrate; and
   a heat conductive member formed as a single member provided between the projecting heat transfer portion of the heat dissipating device and the heat dissipating surface of the electronic part and between an outer circumference of the projecting heat transfer portion of the heat dissipating device and an inner circumference of the frame-shaped connecting portion,
   wherein the projecting heat transfer portion of the heat dissipating device is inserted into the opening portion of the substrate to press the heat conductive member formed as the single member so that a part of the heat conductive member formed as the single member seals a first gap that is a space between the outer circumference of the projecting heat transfer portion and the inner circumference of the substrate to block access by dust to a second gap that is a space between the frame-shaped connecting portion and the substrate.

2. The electronic unit according to claim 1,
   wherein the heat dissipating device comprises a heat dissipating portion, and the projecting heat transfer portion of the heat dissipating device transfers heat to the heat dissipating portion, and
   wherein the projecting heat transfer portion has a rectangular section when seen from a front.

3. The electronic unit according to claim 2,
wherein the heat dissipating portion is formed by a plurality of heat dissipating fins,
wherein the projecting heat transfer portion is formed continuously in a section when seen from a side, and
wherein a direction in which the projecting heat transfer portion is formed continuously in the section when seen from the side is the same as a direction in which grooves are defined by the plurality of heat dissipating fins.

4. The electronic unit according to claim 2,
wherein the projecting heat transfer portion has one of a trapezoidal shape which expands obliquely as it extends towards a proximal end, a shape in which two rectangles which differ in size are superposed on each other in two stages in section, a shape in which a distal end portion is formed into an obtuse-angled shape in section and a shape in which a distal end face is formed into a waveform when seen from a side.

5. The electronic unit according to claim 3,
wherein the projecting heat transfer portion has one of a trapezoidal shape which expands obliquely as it extends towards a proximal end, a shape in which two rectangles which differ in size are superposed on each other in two stages in section, a shape in which a distal end portion is formed into an obtuse-angled shape in section and a shape in which a distal end face is formed into a waveform when seen from a side.

6. The electronic unit according to claim 2, comprising a biasing device which biases the heat dissipating device towards the electronic part.

7. The electronic unit according to claim 3, comprising a biasing device which biases the heat dissipating device towards the electronic part.

8. The electronic unit according to claim 1,
wherein the projecting heat transfer portion has one of a trapezoidal shape which expands obliquely as it extends towards a proximal end, a shape in which two rectangles which differ in size are superposed on each other in two stages in section, a shape in which a distal end portion is formed into an obtuse-angled shape in section and a shape in which a distal end face is formed into a waveform when seen from a side.

9. The electronic unit according to claim 4, comprising a biasing device which biases the heat dissipating device towards the electronic part.

10. The electronic unit according to claim 5, comprising a biasing device which biases the heat dissipating device towards the electronic part.

11. The electronic unit according to claim 8, comprising a biasing device which biases the heat dissipating device towards the electronic part.

12. The electronic unit according to claim 1, comprising a biasing device which biases the heat dissipating device towards the electronic part.

13. The electronic unit according to claim 1, comprising a biasing device which biases the heat dissipating device towards the electronic part.

14. The electronic unit according to claim 13,
wherein the biasing device comprises a plate spring having an internally threaded portion which allows the heat dissipating device to be fixed with a bolt.

15. The electronic unit according to claim 1,
wherein the heat conductive member has a sheet-like shape, and
wherein the projecting heat transfer portion of the heat dissipating device is inserted into the opening portion of the substrate to plastically deform the heat conductive member so that an outer circumferential end portion of the sheet-like shape of the heat conductive member seals the first gap between the outer circumference of the projecting heat transfer portion and the inner circumference of the substrate to block access by dust to the second gap between the frame-shaped connecting portion and the substrate.

16. The electronic unit according to claim 1,
wherein the electronic part comprises a display device, and
wherein the heat dissipating device is a heat sink.

17. A projector comprising:
the electronic unit according to claim 1, wherein the electronic part comprises a display device;
a light source unit comprising a red light source device, a green light source device, and a blue light source device;
a light source-side optical system configured to guide light from the light source unit to the display device;
a projection-side optical system configured to project an image emitted from the display device; and
a projector control unit configured to control the light source unit and the display device.

18. The electronic unit according to claim 1,
wherein the first gap is larger than the second gap.

19. A fabrication method comprising:
disposing a substrate having an inner circumference that defines an opening portion and a heat dissipating surface of an electronic part, wherein the electronic part is connected to the substrate via a frame-shaped connecting portion, such that the electronic part and the substrate face each other and are fixable in position;
placing a sheet-shaped heat conductive member having a predetermined thickness on the heat dissipating surface of the electronic part; and
disposing a heat dissipating device comprising a heat dissipating portion and a projecting heat transfer portion configured to transfer heat to the heat dissipating portion such that the projecting heat transfer portion is inserted into the opening portion of the substrate to plastically deform the heat conductive member so that a part of the heat conductive member seals a first gap that is a space between an outer circumference of the projecting heat transfer portion and the inner circumference of the substrate to block access by dust to a second gap that is a space between the frame-shaped connecting portion and the substrate.

* * * * *